US009748965B2

(12) United States Patent
Francis et al.

(10) Patent No.: US 9,748,965 B2
(45) Date of Patent: Aug. 29, 2017

(54) PIPELINE ADC AND REFERENCE LOAD BALANCING CIRCUIT AND METHOD TO BALANCE REFERENCE CIRCUIT LOAD

(71) Applicant: Texas Instruments Incorporated, Dallas, TX (US)

(72) Inventors: Roswald Francis, Bangalore (IN); Visvesvaraya A. Pentakota, Karnataka (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 14/848,499

(22) Filed: Sep. 9, 2015

(65) Prior Publication Data

US 2016/0072518 A1 Mar. 10, 2016

Related U.S. Application Data

(60) Provisional application No. 62/048,395, filed on Sep. 10, 2014.

(51) Int. Cl.

| H03M 1/00 | (2006.01) |
|---|---|
| H03M 1/06 | (2006.01) |
| H03M 1/12 | (2006.01) |
| H03M 1/16 | (2006.01) |
| H03M 1/36 | (2006.01) |

(52) U.S. Cl.
CPC .......... *H03M 1/0604* (2013.01); *H03M 1/00* (2013.01); *H03M 1/0695* (2013.01); *H03M 1/12* (2013.01); *H03M 1/167* (2013.01); *H03M 1/361* (2013.01)

(58) Field of Classification Search
CPC ......... H03M 1/00; H03M 1/12; H03M 1/0695
USPC ............... 341/122, 120, 161, 155
See application file for complete search history.

(56) References Cited

U.S. PATENT DOCUMENTS

| 5,412,387 A | 5/1995 | Vincelette et al. |
|---|---|---|
| 5,451,950 A | 9/1995 | Vincelette et al. |
| 6,559,787 B1 | 5/2003 | Aude et al. |
| 6,836,228 B1 | 12/2004 | Levinson et al. |
| 6,906,658 B2 | 6/2005 | Pentakota et al. |
| 7,095,356 B1 | 8/2006 | Pentakota et al. |
| 7,209,060 B2 * | 4/2007 | Kumar ............... H03M 1/0678 341/118 |
| 2006/0038712 A1 | 2/2006 | Harrison et al. |
| 2007/0024485 A1 * | 2/2007 | Kumar ............... H03M 1/0678 341/161 |

* cited by examiner

*Primary Examiner* — Joseph Lauture
(74) *Attorney, Agent, or Firm* — Tuenlap D. Chan; Charles A. Brill; Frank D. Cimino

(57) ABSTRACT

Disclosed examples include pipeline ADC, balancing circuits and methods to balance a load of a reference circuit to reduce non-linearity and settling effects for a reference voltage signal, in which balancing capacitors are connected to a voltage source in a pipeline stage ADC sample time period to precharge the balancing capacitors using a voltage above the reference voltage, and a selected set of the precharged balancing capacitors is connected to provide charge to the output of the reference circuit during the second time period.

20 Claims, 9 Drawing Sheets

PIPELINE ADC AND REFERENCE LOAD BALANCING CIRCUIT AND METHOD TO BALANCE REFERENCE CIRCUIT LOAD

REFERENCE TO RELATED APPLICATION

Under 35 U.S.C. §119(e), this application claims priority to, and the benefit of, U.S. provisional patent application Ser. No. 62/048,395, entitled "REFERENCE LOAD BALANCING TECHNIQUE FOR REDUCTION OF NON-LINEARITY DUE TO REFERENCE BUFFER IN A SWITCHED CAPACITOR CIRCUIT MINIMIZING THE EFFECT OF REFERENCE SETTLING", and filed on Sep. 10, 2014, the entirety of which is hereby incorporated by reference.

TECHNICAL FIELD

The presently disclosed embodiments are related to reference voltage circuits and pipeline analog to digital converters (ADCs).

BACKGROUND AND INCORPORATION BY REFERENCE

Pipeline ADC or subranging quantizer circuits include two or more subconverters or converter stages to provide a digital output representing an analog input signal. Individual stages generate one or more digital output signals or bits and provide an analog residue or remainder signal for conversion by a subsequent stage. An error correction circuit processes the digital outputs from the individual stages and generates a multibit digital output representing sample of the original input signal. High speed pipeline ADCs use a reference voltage for conversion of the input signal to a digital output code, and the reference voltage is typically generated internally. The reference voltage is used to drive digital to analog converter (DAC) circuits in the pipeline stages, and the DAC load presented to the reference buffer amplifier often includes a switched capacitor circuit with the loading changing in successive clock cycles. The internal reference voltage is buffered by an amplifier in order to provide the necessary drive strength to accommodate the switching capacitor load. However, the finite bandwidth of the reference buffer amplifier results in reference voltage error, such as settling error in one clock period. Moreover, the switching load is input signal dependent. This can cause undesirable effects. The settling of reference voltage in the hold or residue calculation time period or phase can be affected by the signal dependent load, resulting in non-linearities at the ADC output. For a high resolution ADC, tolerable reference voltage settling error decreases exponentially with the number of resolved bits. In addition, a low frequency input signal can result in a drooping of the reference voltage since a signal dependent average current would be flowing through the output impedance of the reference buffer. For a high resolution ADC, tolerable error in the reference voltage becomes very small, and improved reference voltage circuits are desirable. U.S. Pat. No. 7,209,060 to Kumar et al., incorporated herein by reference in its entirety, describes circuits and techniques for providing a substantially constant reference voltage in a pipeline ADC.

SUMMARY

Disclosed examples include pipeline ADC, balancing circuits and methods to balance a load of a reference circuit to reduce non-linearity and settling effects for a reference voltage signal, in which balancing capacitors are connected to a voltage source in a pipeline stage ADC sample time period to precharge the balancing capacitors using a voltage above the reference voltage, and a selected set of the precharged balancing capacitors is connected to provide charge to the output of the reference circuit during the second time period.

DETAILED DESCRIPTION

Figure 1:
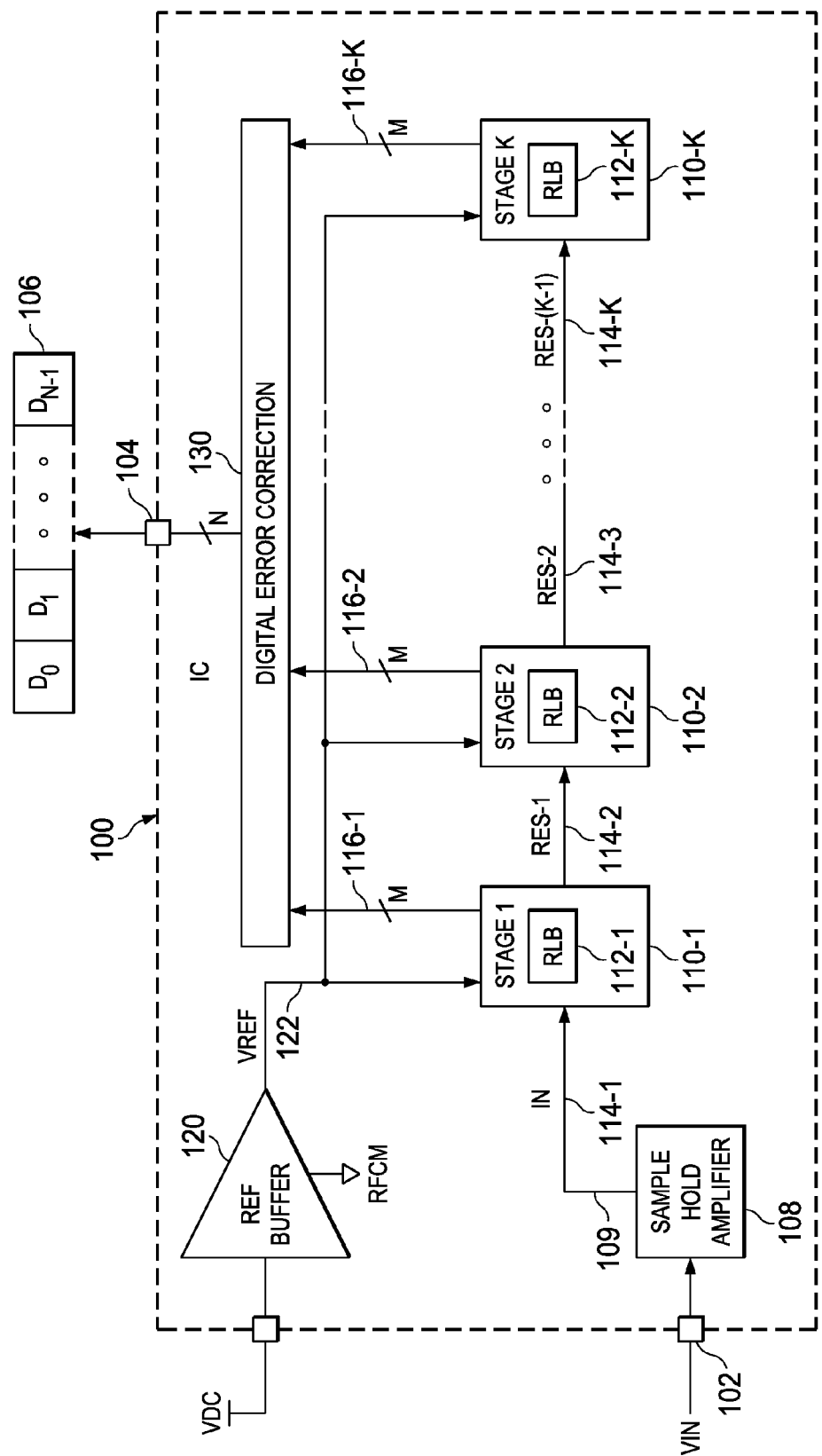
FIG. 1 is a schematic diagram of a pipeline ADC with reference load balancing (RLB) circuits in individual converter stages.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . ." Also, the term "couple" or "couples" is intended to include indirect or direct electrical connection or combinations thereof. For example, if a first device couples to or is coupled with a second device, that connection may be through a direct electrical connection, or through an indirect electrical connection via one or more intervening devices and connections.

FIG. 1 shows a pipeline ADC circuit 100, in one example an integrated circuit (IC). The pipeline ADC IC 100 operates using power from a DC voltage supply VDC. The pipeline ADC 100 receives an input signal VIN at an input terminal 102 and provides a digital output 106 from an output 104, which can be a single serial output pin or a multi-pin parallel data output port. The digital output 106 is a multi-bit signal or value including an integer number N bits $D_0, D_1, \ldots D_{N-1}$, where N is greater than or equal to 2. A sample hold amplifier circuit 108 receives the input signal VIN and includes an output 109 the provides a sample hold output signal IN representing a sample of the analog input signal VIN. The IN signal is provided to an input 114-1 the first converter stage 110-1. The first converter stage 110 includes an output 116-1 to provide an M-bit stage digital output signal to a digital error correction circuit 130, where M is less than N. The pipeline ADC 100 includes an integer number K converter stages 110-1, 110-2, . . . , 110-K, with the individual stages 110 including an analog input 114-1, 114-2, . . . , 114-K receiving an analog stage input signal and an output 116-1, 116-2, . . . , 116-K providing corresponding M-bit stage digital output signal representing the received analog stage input signal to the digital error correction circuit 130.

The pipeline ADC circuit 100 also includes a reference circuit 120 that receives the VDC voltage signal and includes an output 122 that provides a reference voltage signal VREF relative to a reference common node RFCM. The reference circuit 120 can include a reference source, such as a bandgap reference in one example (not shown) with a reference buffer amplifier providing the output 122 to drive one or more load circuits. The output 122 in FIG. 1 provides the reference voltage signal VREF to the converter stages 110 for use in analog to digital conversion. In particular, the converter stage circuits 110 receive the reference voltage signal VREF for operating stage ADC circuits 200 and stage DAC circuits 210 as illustrated further below in connection with FIGS. 3 and 4. The converter stages 110-1, 110-2, . . . , 110-K also include corresponding reference load-balancing (RLB) circuits 112-1, 112-2, . . . , 112-K to balance the load of the reference circuit 120 as described further below.

The first stage 110-1 receives the initial input sample signal IN, and the subsequent converter stages 110-2, . . . 110-K receive an analog residual signal RES-1, RES-2, . . . RES-(K−1) from a preceding converter stage 110 as shown in FIG. 1. The converter stages 110-1 through 110-(K−1) generate a corresponding analog residue output signal by multiplying an error signal by a residue gain value to present an analog input to the succeeding converter stage 110. The circuit 130 receives the M-bit sub-codes from the converter stages 110 and performs digital error correction and assembly functions as are known to generate the N-bit digital output signal 106 of the pipeline ADC 100. The ADC 110 operates in a series of phases or time periods, referred to herein as a sample phase "S" and a hold phase "H". The converter stages 110 sample the corresponding stage analog input signals IN, RES during the first or sample phase S, and generate the analog residue output signals RES during the second or hold phase H.

Figure 2:
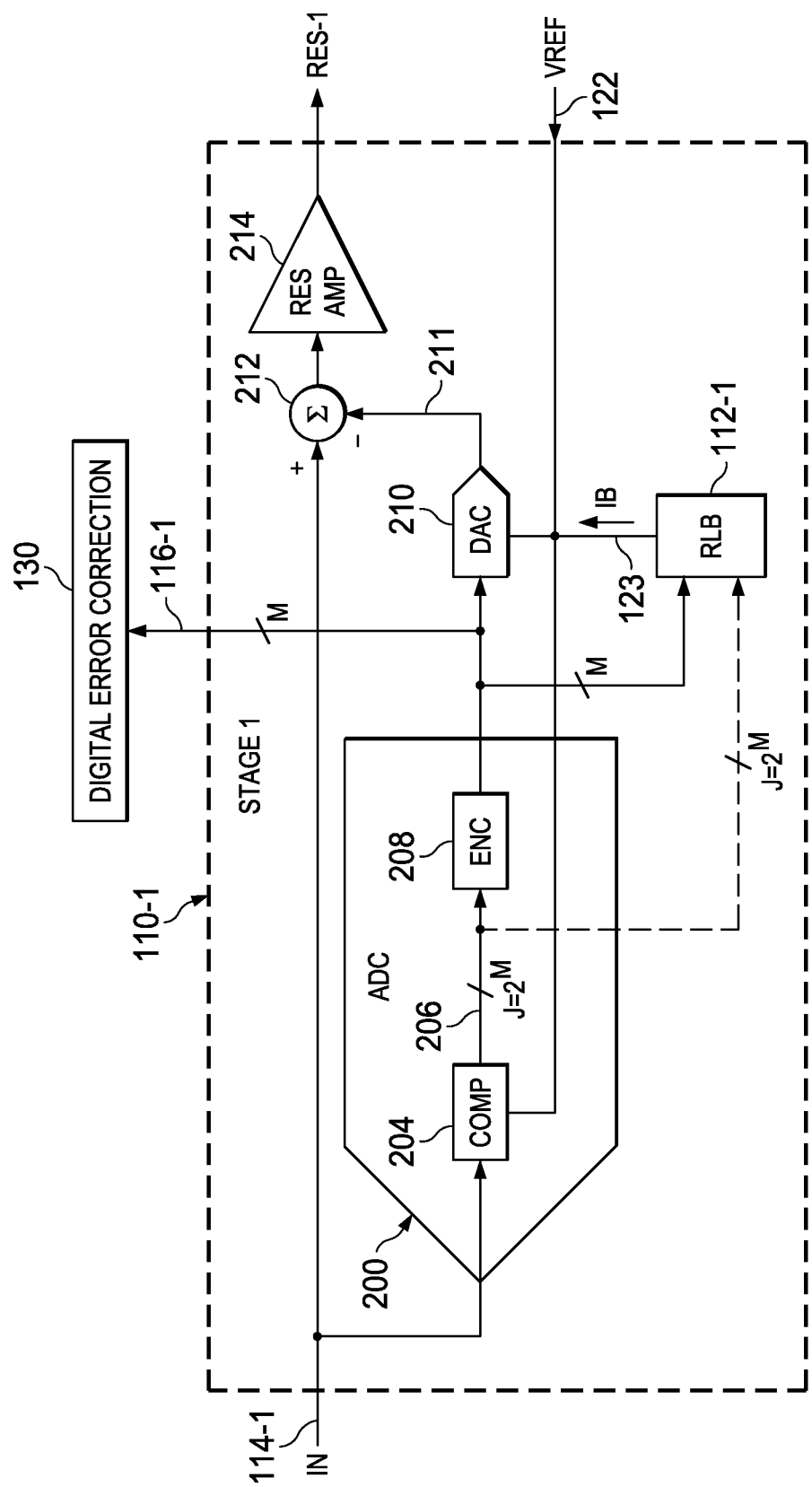
FIG. 2 is a schematic diagram of a converter stage in the pipeline ADC of FIG. 1.

FIG. 2 shows further details of the first converter stage 110-1 receiving the signal IN from the sample hold amplifier circuit output 109. The subsequent converter stages 110-2 through 110-K are constructed in similar fashion in certain examples. The stage input 114-1 receives the corresponding analog stage input signal IN from the sample hold circuit 108, and a stage analog to digital converter (stage ADC) 200 converts the analog signal IN to generate the M-bit stage digital output signal 116-1. In one example, the stage ADC 200 includes a comparator circuit 204 with an integer number $J=2^M$ comparators providing a J-bit set of comparator digital output signals 206 to an encoder circuit 208 that provides the M-bit stage digital output signal 116-1. As further shown in FIG. 3, the stage ADC circuit 200 in one example is a flash ADC with J=8 comparators, and the encoder circuit 208 provides a M=3-bit stage digital output signal 116-1.

As further shown in FIG. 2, the stage ADC 200 provides the M-bit stage digital output signal 116-1 as a digital input to a stage digital to analog converter (DAC) 210 which generates a stage analog signal 211 and provides the analog signal 211 to a summing circuit 212. In addition, the summing circuit 212 provides an error signal as the difference between the stage analog input signal IN and the stage analog signal 211 from the stage DAC 210. The error signal is amplified by a residue amplifier circuit 214, for example, using a gain of four for a 3-bit stage DAC 210. As described below in FIG. 4, the stage DAC 210 includes a switched capacitor circuit with an analog output to deliver the stage analog signal 211 to a summing node or summing junction 212 in one example. The voltage reference signal VREF is delivered from the reference circuit output 122 to the stage ADC 200 as well as to the switched capacitor circuit of the stage DAC 210. In addition, as shown in FIG. 2, the stage reference load balancing circuit 112-1 (RLB) receives either the M-bit stage digital output signal 116-1 or the J-bit comparator digital output signals 206. The balancing circuit 112-1 includes an output 123 connected to the reference circuit output 122 and the balancing circuit output 123 provides balancing charge as a current IB to balance the load of the reference circuit 120 as described further below.

Figure 3:
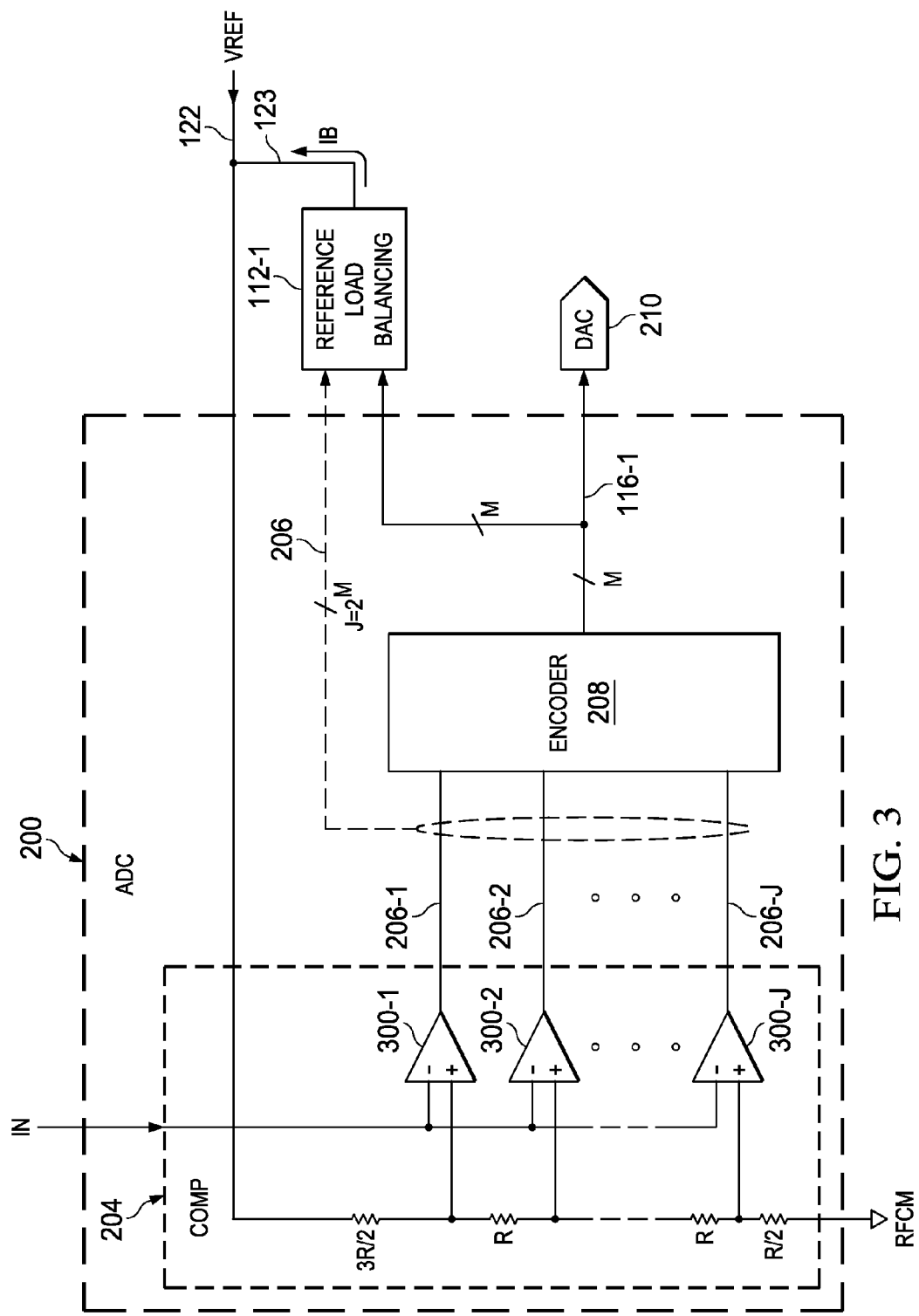
FIG. 3 is a schematic diagram of a stage ADC circuit in the converter stage of FIG. 2.

FIG. 3 shows details of an example stage ADC circuit 200 including a comparator circuit 204 with a resistor divider circuit including an upper resistor with a value 3R/2 coupled to receive the voltage reference signal VREF from the reference circuit output 122, along with intermediate resistors with a value R, and a lower resistor with a value R/2. The stage ADC circuit 200 in this example is a flash ADC with an integer number J comparators 300-1, 300-2 . . . , 300-J. The individual comparators 300 include a negative (−) input connected to the stage analog input signal IN and a positive (+) input connected to a corresponding node of the resistive divider circuit. The comparators 300-1, 300-2 . . . , 300-J respectively provide digital output signals 206-1, 206-2, . . . , 206-J to a stage ADC encoder circuit 208 which provides the M-bit stage digital output signal 116-1 as an input to the stage DAC 210. In one example, the stage digital output signal 116-1 is also provided as a set of M input signals to the balancing circuit 112-1. In another example, the stage ADC 200 provides the J-bit digital output signals 206 from the comparator circuit 200 for as an input to the balancing circuit 112-1.

Figure 4:
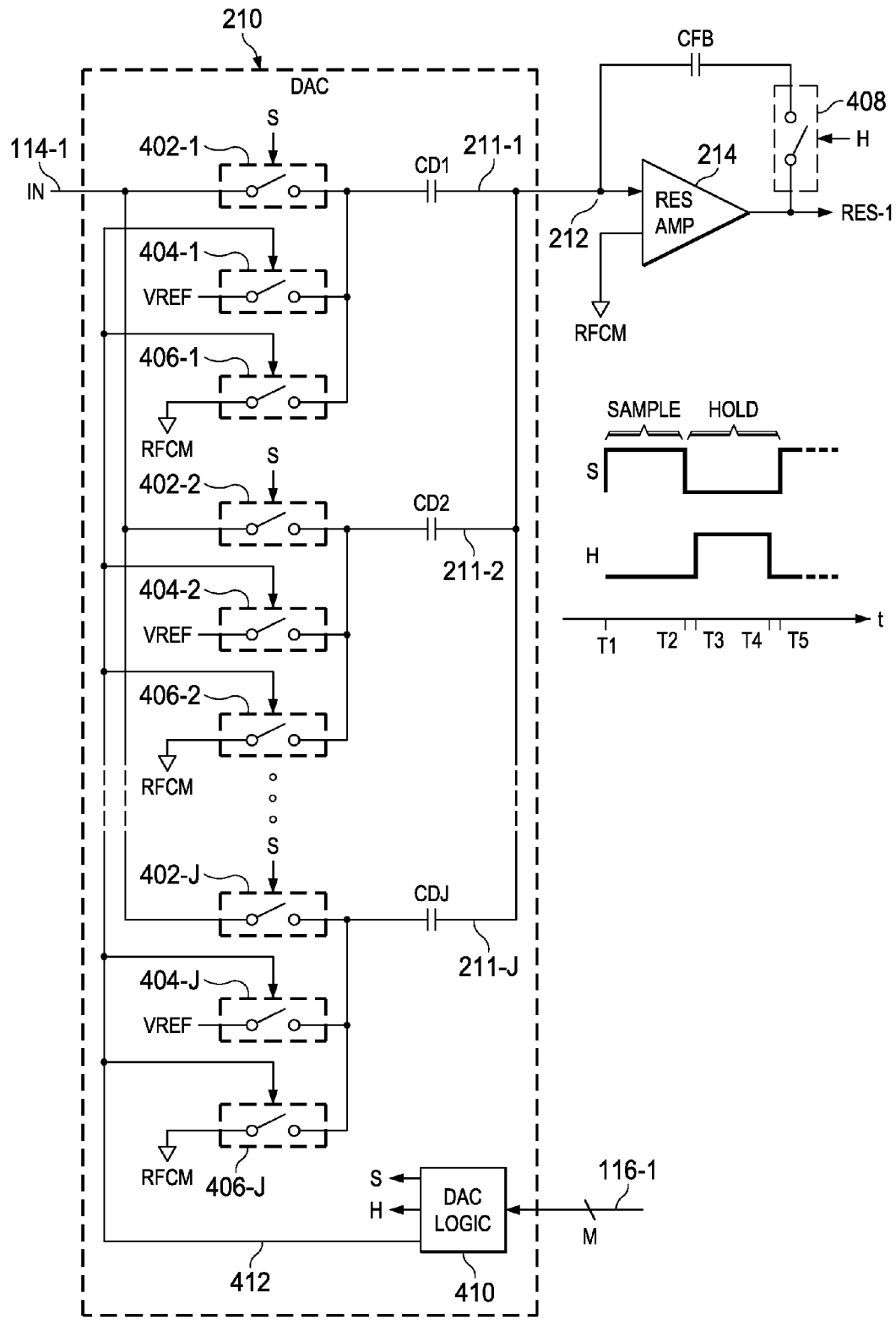
FIG. 4 is a schematic diagram of a switched capacitor DAC circuit and residue amplifier circuit in the converter stage of FIG. 2.

FIG. 4 shows further details of an example stage DAC circuit 210, including a DAC logic circuit 410 that receives the M-bit stage digital output signal 116-1 and generates phase switching control signals S and H for operating in the first or sample time period (S) and the second or hold sample period (H). In addition, the DAC logic circuit 410 also generates control signals 412 to generate and provide a stage analog signal at the DAC output 211 representing the analog stage input signal IN. The stage DAC 210 includes an integer number J DAC sampling or input capacitors CD1, CD2, . . . CDJ. An integer number J first switches 402-1, 402-2, . . . 402-J are connected between a corresponding DAC capacitor CD and the stage analog input signal IN, and an integer number J second switches 404-1, 404-2, . . . 404-J are connected between the corresponding DAC capacitor CD and the reference voltage signal VREF. Third DAC switches 406-1, 406-2, . . . 406-JR connected between the corresponding DAC capacitor CD and the reference common node RFCM. The individual DAC capacitors CD1, CD2, . . . CDJ include a second terminal connected to a corresponding output node 211-1, 211-2, . . . 211-J, and the nodes 211 are connected to the summing node 212. The summing node provides a first input to the residue amplifier 214, with the second residue amplifier input connected to the common node RFCM. A feedback circuit for the residue amplifier 214 includes a residue amplifier feedback capacitor CFB connected from the summing node 212 through a feedback switch 408 to the residue amplifier output, and the residue amplifier 214 provides the analog stage residue output signal RES-0 1.

The stage DAC circuit 210 includes a switched capacitor circuit with DAC capacitors CD and switches 402, 404, 406 and 408, as well as an analog output 211 to provide a stage analog signal representing the analog stage input signal IN (or the stage input signal RES for the other converter stages 110-2, . . . 110-J in FIG. 1) according to the reference voltage signal VREF and the stage digital output signal 116. The stage DAC circuit 210 is operated in a repeating series of sample and hold phases or time periods, represented by the S and H switching control signals from the logic circuit 410, as shown in the waveform diagram of FIG. 4. In the first time period S (e.g., sample phase) beginning at time T1 until time T2, the DAC logic circuit 410 asserts the S signal to cause the stage DAC 210 to sample the input signal IN by closing the first switches 402-1, 402-2, . . . 402-J. This charges the DAC capacitors CD1, CD2, . . . CDJ to the input voltage IN while the residue amplifier feedback switch 408 is open. In the second time period H (hold or residue calculation phase) beginning at time T3 until time T4, the feedback switch 408 is closed by the H control signal from the DAC logic circuit 410.

During the second time period H, the logic circuit 410 provides the switch control signals 412 to open the first switches 402-1, 402-2, . . . 402-J, and to close one of the second or third switches 404 or 406 associated with individual ones of the DAC capacitors CD1, CD2, . . . CDJ. In particular, the DAC logic circuit 410 provides the control signals 412 during the second time period H such that the input terminals each DAC capacitor CD is connected either to the reference voltage signal VREF (by closing the corresponding second switch 404 while the corresponding third switch 406 is open) or to the common node RFCM (by opening the corresponding second switch 404 while closing the corresponding third switch 406) according to the stage digital output signal 116. The DAC capacitor CD transfer a charge proportional to the difference (e.g., residue) of the input signal and the VREF or RFCM signal voltages to the feedback capacitor CFB from time T3 until time T4, and the residue is amplified by the residue amplifier 214 and provided as the amplified residue signal RES-1 to the next stage in the pipeline ADC 100. The dual phase operation repeats again as described above, beginning again at time T5 where the S signal again goes high as seen in the timing diagram FIG. 4. General operation of pipeline ADC converters and converter stages thereof is described in U.S. Pat. No. 7,209, 060 to Kumar et al., incorporated herein by reference in its entirety.

Figure 5:
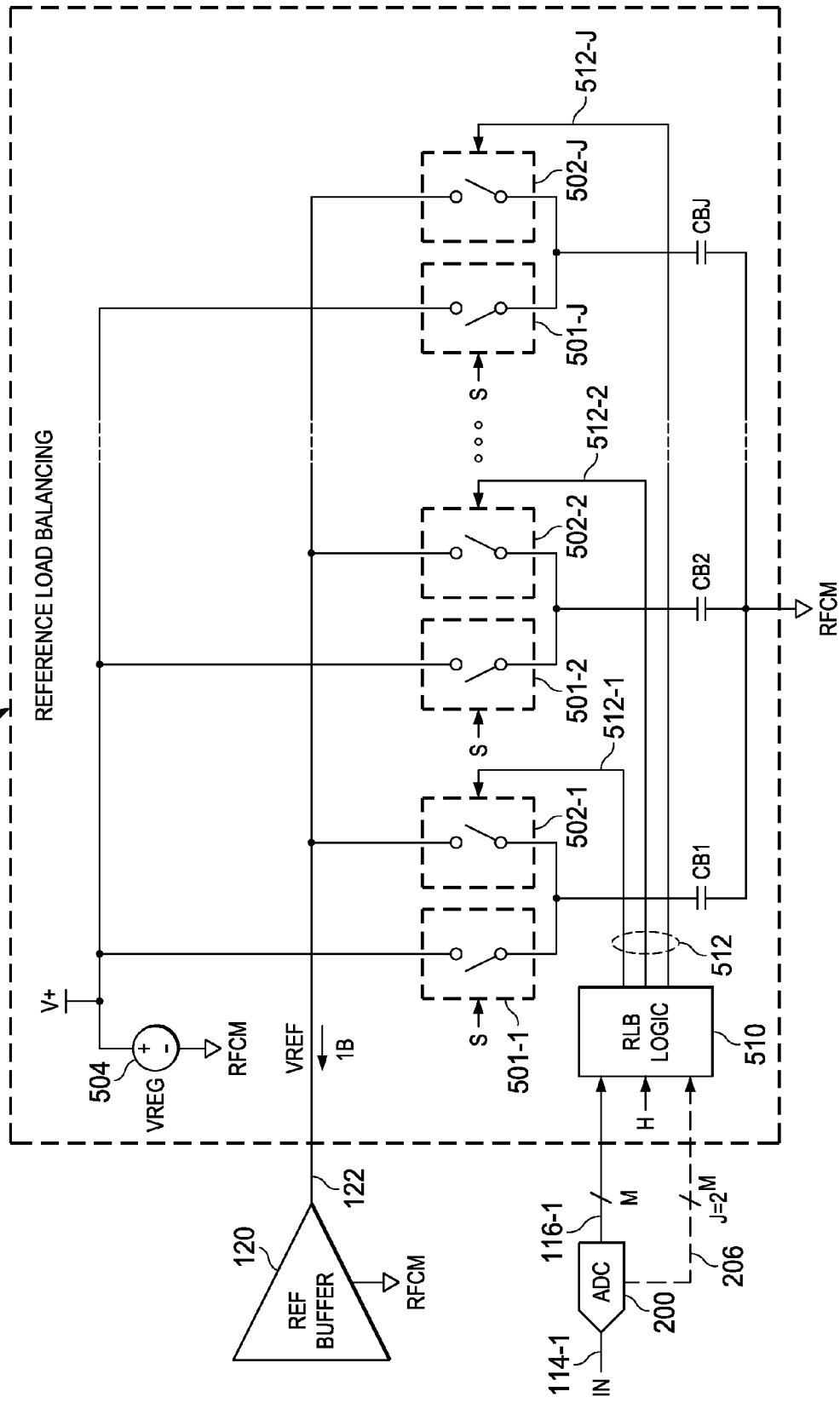
FIG. 5 is a schematic diagram of a reference load balancing circuit in the converter stage of FIG. 2.

FIG. 5 illustrates a balancing circuit 112-1 for the first converter stage 110-1 (e.g., a correction circuit) to balance a load of the reference circuit 120, and thereby facilitate stability in the reference voltage signal VREF. The balancing circuit 112 can be used in connection with any load circuit, for example, the switching capacitor circuitry CD, 402, 404, 406 and 408 in the stage DAC 210. The pipeline ADC 100 includes multiple converter stages 110, and balancing circuits 112 are individually associated with a corresponding one of the converter stages 110. In this example, the stage DACs 210 present loads or load circuits to the reference circuit 120, and include switched capacitor DAC circuits that present an input signal dependent switching load. The balancing circuit 112 can be used in combination with other forms of load circuits. In the illustrated example, a balancing circuit 212 is included in the individual converter stages 110 of FIG. 1 to locally balance the switched, input signal dependent, loading presented to the shared reference circuit 120 by the local stage DAC circuit 210. The balancing circuit 112 includes balancing capacitors CB, along with a first circuit formed by an integer number J first switches 501-1, 501-2, . . . , 501-J operated by the S control signal (e.g., from the DAC logic circuit 410 in FIG. 4) and J second switches 502-1, 502-2, . . . , 502-J. The first switches 501 connect the capacitors CB to the voltage source 504 during the first time period S, and disconnect the capacitors CB from the voltage source 504 during the second time period H. In one example, all the balancing capacitors are charged during the first time period. In other examples, fewer than all the capacitors CB are charged during the first time period. The balancing circuit 112 also includes a second or RLB logic circuit 510 providing control signals 512-1, 512-2, . . . , 512-J to operate the second switches 502-1, 502-2, . . . , 502-J.

The first circuit 501, 502 charges one or more of the capacitors CB using a voltage source 504 during the first time period S by the logic circuit 510 (or the DAC logic 410 in FIG. 4) providing the S control signal to close the switches 501-1, 501-2, . . . , 501-J. In this configuration, the capacitors CB are charged to a voltage V+ of the source 504. In one example, the voltage source 504 has a voltage V+ that is greater than the reference voltage signal VREF. During the first time period S, the RLB logic circuit 510 selects one or more of the charged capacitors CB according to an expected load of the stage DAC 210 in the upcoming second time period H. During the second time period H, the logic circuit 510 provides the control signals 512 to connect the selected one or more capacitors CB to the output 122 of the reference circuit 120, indicated as balancing current IB in FIG. 5. The second switches 502 selectively connect the corresponding capacitor CB to the output 122 of the reference circuit 120 when the corresponding control signal 512 is in a first state, and disconnect the corresponding capacitor CB from the reference circuit output 122 when the corresponding control signal 512 is in a second state.

The RLB logic circuit 510 provides the control signals 512 in the second state to the second switches 502 during the first time period S, and selectively provides the control signals 512 in the first state to a selected set of the second switches 502 corresponding to the selected one or more capacitors CB during the second time period H. In addition, the RLB logic circuit provides the control signals 512 in the second state to any remaining unselected second switches 502 during the second time period H. As a result, the amount of correction or balancing charge provided by the balancing circuit 112 during the second time period H is controlled by the logic circuit 510. In this manner, the balancing circuit 112 provides charge from the selected charged balancing capacitors CB to the reference circuit output 122 according to the signals 512 during the second time period H during which the stage DAC 210 has its capacitors CD connected to the reference circuit output 122.

The amount of balancing or correction charge is tailored to the stage DAC loading during the second time period H since the RLB control circuit 510 intelligently selects the charged balancing capacitors CB for connection to the reference circuit output 122. In one example, the RLB control circuit 510 determines the expected load of the stage DAC load circuit 210 for the upcoming second time period H by generating the control signals 512 according to the stage digital output signal 116 or the comparator output signals 206 from the stage ADC 200 (FIG. 3) representing the amplitude of the analog stage input signal received by the converter stage 110 (e.g., IN for the first stage 110-1, or RES for the other stages 110). The amount of balancing charge provided by the balancing circuit 112 is dependent on the stage analog input signal IN, RES, and this counteracts or may completely cancel the loading charge provided by the reference circuit 120 attributable to the corresponding stage DAC circuit 210, which also depends on the stage analog input signal IN, RES.

Figure 6:
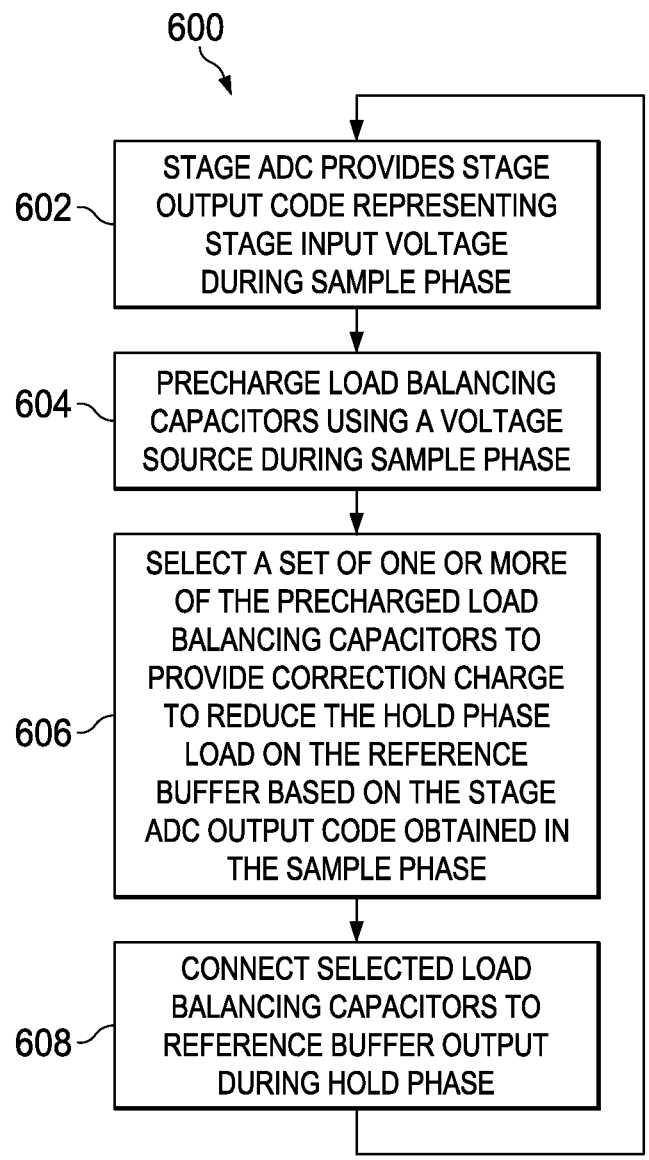
FIG. 6 is a flow diagram of a method of providing a reference signal.

FIG. 6 shows a method 600 of providing a reference signal and balancing the loading of a reference signal source, such as the reference circuit 120. In one example, a reference voltage signal VREF is provided at an output 122 of a reference circuit 120, and the reference voltage signal VREF is provided to a load circuit 210 in first and second time periods S and H. At 602, an expected load of the load circuit 210 in an upcoming second time period H is determined during the first time period S. In one implementation, the stage ADC (e.g. 200 in FIGS. 2 and 3 above) provides a stage output code or stage digital output signal (e.g., 116) at 602 in FIG. 6, where the code represents the stage analog input voltage signal amplitude during the first time period or sample phase S. At 604, the load balancing capacitors CB (all or at least some of them) are charged by connecting the capacitors CB to the voltage source 504 during the first time period S. At 606, a set of one or more of the charged capacitors CB is selected during the first time period S, according to the expected load of the stage DAC or other load circuit 210 in the second time period H. At 608, during the second time period H, the selected capacitors CB are connected to the reference circuit. This provides compensating or correction charge to the output 122 of the reference circuit 120 during the second time period H when the stage DAC 210 is loading the reference circuit 120 based on the corresponding stage analog input amplitude IN or RES.

Figure 7:
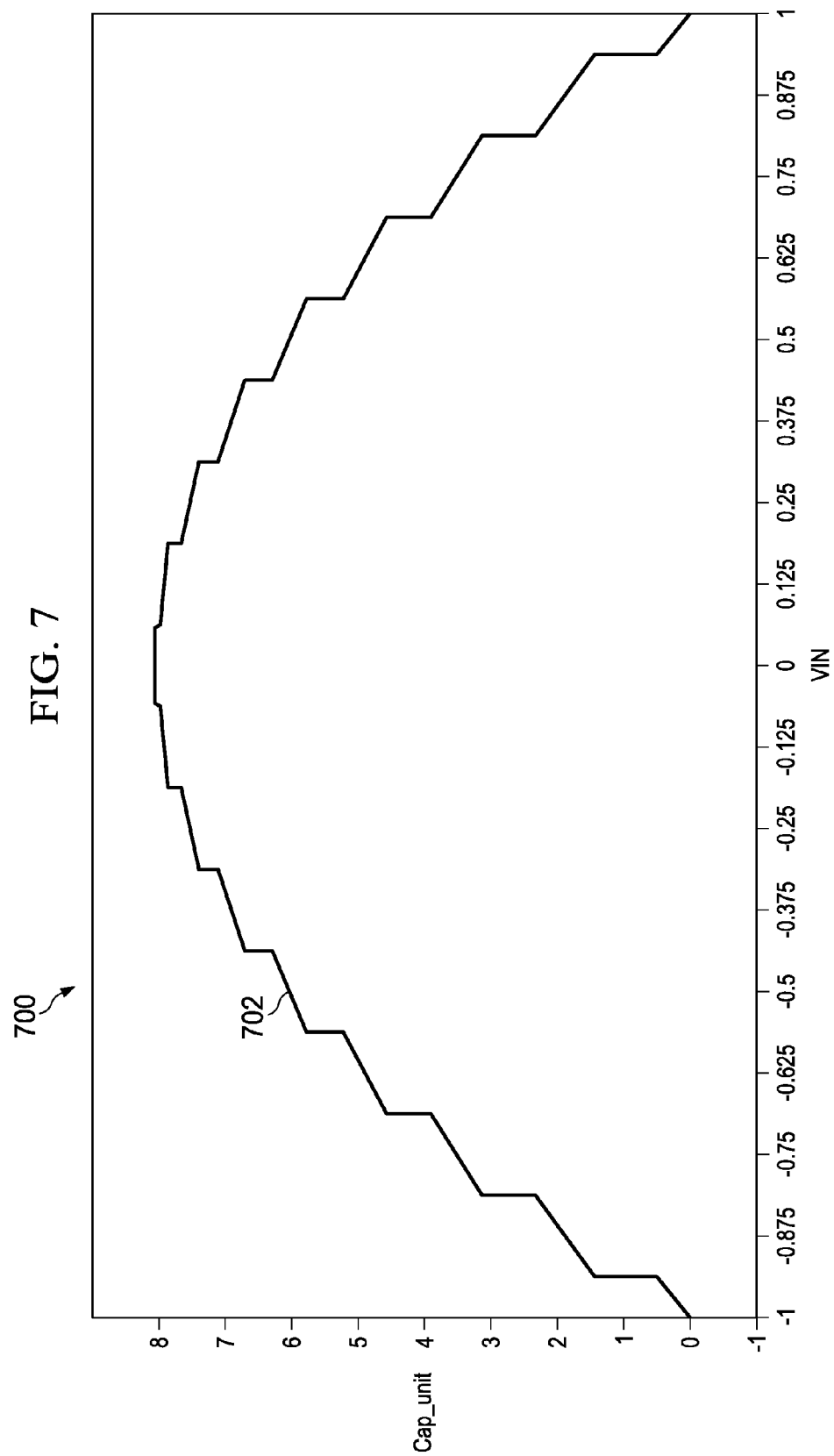
FIG. 7 is a diagram of reference circuit supplied charge without load-balancing.

FIG. 7 shows a graph 700 illustrating a reference circuit supplied charge curve 702 (in capacitance units) without load balancing by the circuit 112 as a function of the input signal VIN. The load seen by the reference circuit 120 because of the DAC capacitors CD switching between the stage input IN and the reference voltage signal VREF varies as a function of input signal as shown by the curve 702. For example, a 14-bit pipeline ADC stage with a 4-bit first stage 110-1 will have 16 unit caps in one side alone for a differential stage, and the maximum effective capacitor load is 8 times the unit capacitance. As shown in FIG. 7, the maximum load (i.e., the maximum charge taken from reference circuit 120) occurs when the differential input VIN=0 and the loading gradually reduces on both sides becoming zero when |VIN|=VREF. The curve 702 is symmetric around VIN=0 and follows a generally parabolic shape. The charge taken from the reference circuit 120 is a measure of the reference settling during the residue calculation phase H and predominantly generates a third harmonic component at the output of the ADC 100.

Figure 8:
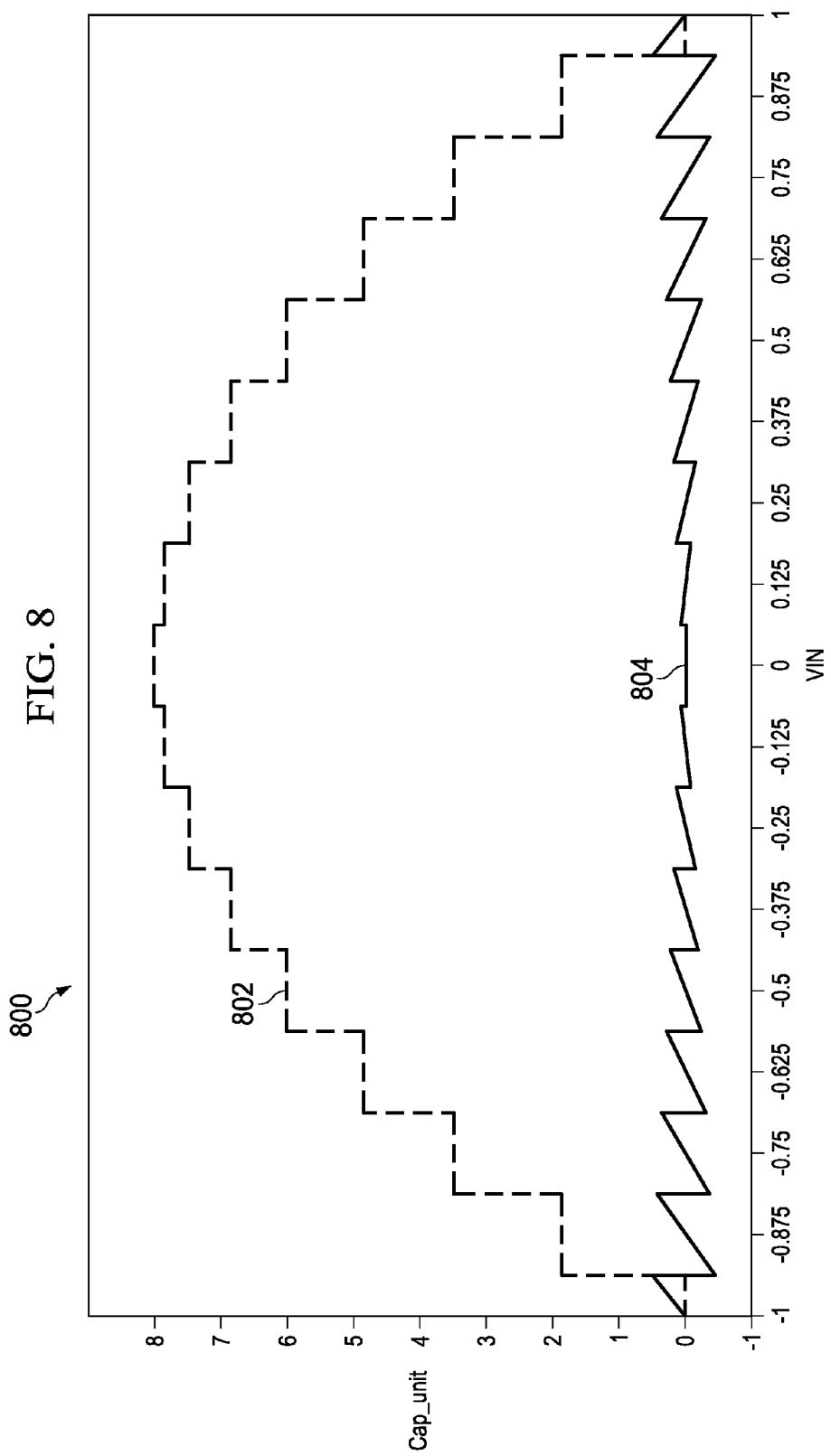
FIG. 8 is a diagram of reference balancing charge supplied at the reference circuit output by the reference load-balancing circuit of FIG. 5, and error charge supplied by the reference circuit.

A graph 800 in FIG. 8 shows a curve 802 illustrating the reference balancing charge supplied at the reference circuit output 122 by the load balancing circuit 112-1 of FIG. 5, and a curve 804 illustrating the error charge supplied by the reference circuit 120 itself during the second time period H, both as a function of the input signal VIN. As seen in FIG. 7, the reference circuit 120 supplies charge that varies according to the input signal amplitude, and hence according to the individual stage analog input signals IN and RES received by the converter stages 110. The curve 802 in FIG. 8 illustrates the input amplitude dependent compensation or balancing charge provided by the balancing circuit 112 also depends in a similar parabolic fashion according to the input amplitude (VIN) of the pipeline ADC 100 and also according to the stage analog input signal amplitude (IN, RES). The resulting net charge applied by the reference circuit 120 is shown by curve 804, which averages to around zero, thus representing a significant improvement compared with the unbalanced curve 702.

As seen above, described examples reduce signal dependent load on reference buffer, thereby relaxing the reference circuit specifications. Since the input signal to the stage 110 is sampled by the stage ADC 200, the digitized information about the input signal amplitude is determined and used to deliver an equivalent amount of charge from the balancing circuit 112 to the reference circuit output 122. The balancing capacitor circuit takes charge from the voltage source 504 in the first time period S and delivers a selected amount of charge in the second time period H to the output 122 of the reference circuit 120. This way the charge supplied by the reference circuit 120 (and also reference droop) is made independent of input signal. In the illustrated example, the charge supplied to the reference circuit output 122 is obtained from a voltage V+ that is higher than the reference voltage VREF. If a sufficiently high supply is not available, the balancing capacitors CB can be charged from another available supply in the S phase and boosted to supply charge to reference circuit output 122 in the H phase.

As seen in the curve 804 of FIG. 8, only a small amount of charge needs to be supplied by the reference circuit 120. This improves the sensitivity to resistance matching requirement of the reference buffer design. In addition, the slew current in the reference circuit 120 can be reduced. In one example, the load improvement is 8 times the unit capacitance, yielding an HD3 (3rd) improvement proportional to 8 times the unit capacitance. In situations where the unit capacitance cannot be reduced due to kT/C noise limitations, the HD3 improvement is nevertheless approximately $2^{BitsResolved-1}$. For example, a 14 bit ADC with first resolution of 4 bits and an HD3 before correction of 78 dB can be improved to ~96 dB after an ideal correction.

The disclosed examples provide improved solutions compared with other approaches. In one approach, the input is sampled on two sets of sampling capacitors, where one set is the actual sampling set, and the other is a dummy set. During the hold phase, both the sampling caps and dummy caps are connected to the reference, but with opposing polarities. This way, the load seen by reference is independent of input. However, this technique provides extra loading on the previous stage amplifier, causing increased power dissipation in the amplifier. Another approach uses separate reference capacitors, and the sampling capacitor never gets connected to the reference. Thus, the reference never see a signal dependent load. The DAC subtraction is carried out using another set of caps, which are refreshed after use. However, the extra set of capacitors causes additional sources for noise, and degrades the amplifier feedback factor, again leading to increase amplifier power dissipation. The approach outlined in U.S. Pat. No. 7,209,060 to Kumar et al. involves load maximization, where the load on the reference is always maximized to the maximum load value, thereby reducing the input signal dependency on the reference. However, the reference always see a fixed maximum load and thus has to deliver corresponding maximal charge. This adversely impacts the reference buffer slew rate, and this approach is sensitive to mismatch of resistance between the capacitor equivalent series resistance (ESR) and the reference output resistance. In a capacitor based residue stage, the DAC settling is worse at higher DAC voltages than at lower DAC voltages because of the time constants involved in the settling of DAC capacitors. Since the reference buffer sees maximum load at larger input voltages during correction, the DAC settling is degraded because of the reference buffer. At low input voltages the correction has negligible effect on DAC settling.

The disclosed example mitigate or avoid these shortcomings by using extra caps whose values can be made small by using appropriately elevated charging voltage V+. The charging voltage source need not be a good voltage source as it is not participating in the analog to digital conversion, and is only connected to the reference during hold phase, thereby reducing the input dependent load on the reference circuit 120. The disclosed examples can improve the third harmonic degradation caused by the reference buffer by 6-30 dB (e.g., depending on the number of bits resolved). Since the solution is based on minimizing the load on reference, resistance mismatch and slew rate effects of reference circuit 120 can be reduced. For a capacitor based residue stage, the sensitivity to reference settling during low differential input is reduced compared to maximum input voltage. At large input voltages, the DAC capacitors CD are already charged to large voltages so that charge provided by reference circuit 120 is less. At low input voltages, the stage DAC 210 settles to small voltages and so the settling is faster. The disclosed examples do not supply or take substantial charge from the reference circuit 120 during maximum input, and thus provide less load on the reference circuit 120 and faster reference settling. At small input voltages, the balancing circuit 112 delivers maximum charge at the reference circuit output 122 where the stage DAC settling is already good. In this manner, the residue amplification is improved at large input voltages.

Figure 9:
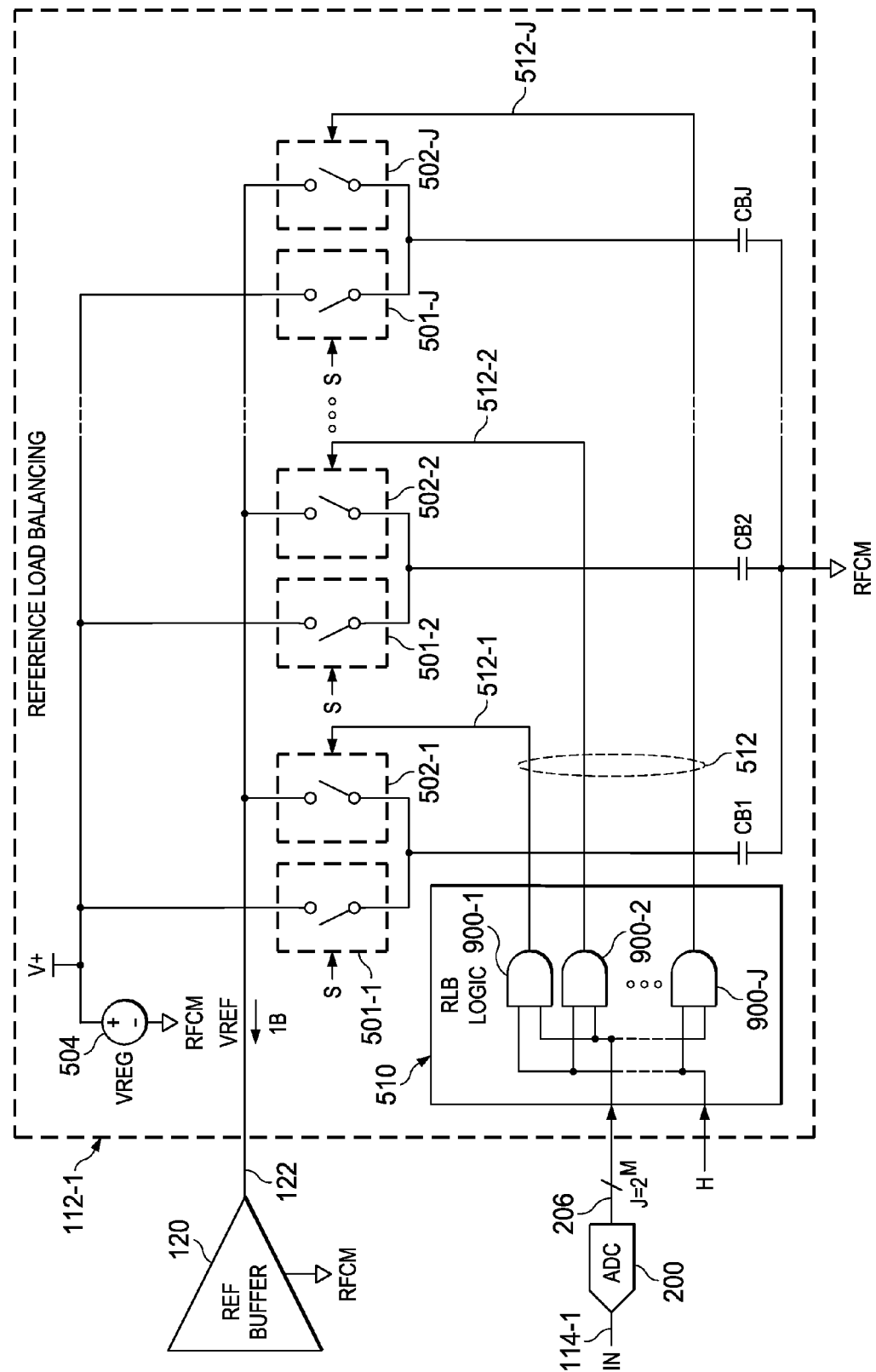
FIG. 9 is a schematic diagram of another example reference load-balancing circuit.

FIG. 9 shows another example reference load-balancing circuit 112-1 in which the RLB logic circuit 510 provides control signals 512 using J AND gates 900-1, 900-2, . . . , 900-J with first inputs receiving the stage ADC comparator outputs 206 and second outputs receiving the H input from the DAC logic 410 (FIG. 4 above). As seen, this example provides a simple, low cost solution for intelligent reference load balancing according to the stage input signal amplitude.

The following is claimed:

1. A balancing circuit to balance a load of a reference circuit with an output that provides a reference voltage signal to a load circuit in first and second time periods (S, H), the balancing circuit comprising:
   capacitors;
   a first circuit operative during the first time period to charge one or more of the capacitors using a voltage source; and
   a second circuit operative during the first time period to select one or more of the charged capacitors according to an expected load of the load circuit in the second time period;
   the first circuit operative during the second time period to connect the selected one or more capacitors to the output of the reference circuit.

2. The balancing circuit of claim 1, wherein the voltage source has a voltage greater than the reference voltage signal.

3. The balancing circuit of claim 2, wherein the first circuit includes:
   first switches to connect the one or more capacitors to the voltage source during the first time period, and to disconnect the one or more capacitors from the voltage source during the second time period; and
   second switches individually associated with a corresponding one of the capacitors, the individual second switches operative when a corresponding control signal is in a first state to selectively connect the corresponding capacitor to the output of the reference circuit, and the individual second switches operative when the corresponding control signal is in a second state to disconnect the corresponding capacitor from the output of the reference circuit;
   wherein the second circuit is operative during the first time period to provide the control signals in the second state to the second switches, wherein the second circuit is operative during the second time period to selectively provide the control signals in the first state to a selected set of the second switches corresponding to the selected one or more capacitors, and wherein the second circuit is operative during the second time period to selectively provide the control signals in the second state to any remaining unselected second switches.

4. The balancing circuit of claim 3, wherein the second circuit is operative during the first time period to select the one or more charged capacitors according to an amplitude of an input signal received by a converter stage of a pipeline analog to digital converter (ADC).

5. The balancing circuit of claim 4, wherein the second circuit is operative during the first time period to select the one or more charged capacitors according to digital output signals from a stage ADC of the converter stage, wherein the digital output signals represent the amplitude of the input signal received by the converter stage during the first time period, and wherein the second circuit is operative during the second time period to generate the control signals according to the digital output signals from the stage ADC.

6. The balancing circuit of claim 2, wherein the second circuit is operative during the first time period to select the one or more charged capacitors according to an amplitude of an input signal received by a converter stage of a pipeline analog to digital converter (ADC).

7. The balancing circuit of claim 6, wherein the second circuit is operative during the first time period to select the one or more charged capacitors according to digital output signals from a stage ADC of the converter stage representing the amplitude of the input signal received by the converter stage during the first time period.

8. The balancing circuit of claim 2, wherein the load circuit is a digital to analog converter (DAC) of the converter stage.

9. The balancing circuit of claim 1, wherein the second circuit is operative during the first time period to select the one or more charged capacitors according to an amplitude of an input signal received by a converter stage of a pipeline analog to digital converter (ADC).

10. The balancing circuit of claim 9, wherein the second circuit is operative during the first time period to select the one or more charged capacitors according to digital output signals from a stage ADC of the converter stage representing the amplitude of the input signal received by the converter stage during the first time period.

11. The balancing circuit of claim 1, wherein the selected one or more capacitors are operative to provide charge to the output of the reference circuit during the second time period to offset loading of the load circuit.

12. A pipeline analog to digital converter (ADC), comprising:
   a sample hold circuit to receive an analog input signal and including an output to provide a sample hold output signal representing a sample of the analog input signal;
   a pipeline circuit including a converter stage, the converter stage including:

a stage input to receive an analog stage input signal from a preceding converter stage or from the sample hold circuit, a stage digital output to provide a stage digital output signal, a stage ADC circuit 200 to generate the stage digital output signal representing the analog stage input signal, and a stage digital to analog converter (DAC), including a switched capacitor circuit, and an analog output to provide a stage analog signal representing the analog stage input signal according to a reference voltage signal and the stage digital output signal;

a reference circuit, including an output to provide the reference voltage signal to the stage DAC of the converter stage; and a balancing circuit to balance a load of the reference circuit, the balancing circuit including:

capacitors, a first circuit operative during a first time period to charge one or more of the capacitors using a voltage source, and a second circuit operative during the first time period to select one or more of the charged capacitors according to an expected load of the stage DAC in a second time period, the first circuit operative during the second time period to connect the selected one or more capacitors to the output of the reference circuit.

13. The pipeline ADC of claim 12, wherein the voltage source has a voltage greater than the reference voltage signal.

14. The pipeline ADC of claim 12, wherein the first circuit includes:

first switches to connect the one or more capacitors to the voltage source during the first time period, and to disconnect the one or more capacitors from the voltage source during the second time period; and second switches individually associated with a corresponding one of the capacitors, the individual second switches operative when a corresponding control signal is in a first state to selectively connect the corresponding capacitor to the output of the reference circuit, and the individual second switches operative when the corresponding control signal is in a second state to disconnect the corresponding capacitor from the output of the reference circuit;

wherein the second circuit is operative during the first time period to provide the control signals in the second state to the second switches, wherein the second circuit is operative during the second time period to selectively provide the control signals in the first state to a selected set of the second switches corresponding to the selected one or more capacitors, and wherein the second circuit is operative during the second time period to selectively provide the control signals in the second state to any remaining unselected second switches.

15. The pipeline ADC of claim 12, wherein the second circuit is operative during the first time period to select the one or more charged capacitors according to an amplitude of the analog stage input signal.

16. The pipeline ADC of claim 15, wherein the second circuit is operative during the first time period to select the one or more charged capacitors according to the stage digital output signal.

17. The pipeline ADC of claim 12, comprising:

a plurality of converter stages; and a plurality of balancing circuits individually associated with a corresponding one of the converter stages.

18. A method of providing a reference signal, comprising:

providing a reference voltage signal at an output of a reference circuit;

providing the reference voltage signal to a load circuit in first and second time periods (S, H);

determining, during the first time period, an expected load of the load circuit in the second time period;

charging capacitors by connecting the capacitors to a voltage source during the first time period;

selecting, during the first time period, a set of one or more of the charged capacitors according to the expected load of the load circuit in the second time period; and connecting, during the second time period, the selected capacitors to the output of the reference circuit to provide charge to the output of the reference circuit during the second time period.

19. The method of claim 18, wherein determining the expected load of the load circuit in the second time period comprises generating, during the first time period, a stage digital output signal representing an analog stage input signal received by a converter stage of a pipeline analog to digital converter (ADC); and wherein connecting the selected capacitors to the output of the reference circuit comprises generating, during the second time period, at least one control signal according to the stage digital output signal, and providing, during the second time period, the at least one control signal to a switched capacitor circuit to connect the selected charged capacitors to the output of the reference circuit.

20. The method of claim 18, wherein the voltage source has a voltage greater than the reference voltage signal.

* * * * *